(12) United States Patent
Zhu et al.

(10) Patent No.: US 6,956,257 B2
(45) Date of Patent: Oct. 18, 2005

(54) MAGNETIC MEMORY ELEMENT AND MEMORY DEVICE INCLUDING SAME

(75) Inventors: Xiaochun Zhu, Pittsburgh, PA (US); Jian-Gang Zhu, Pittsburgh, PA (US)

(73) Assignee: Carnegie Mellon University, Pittsburgh, PA (US)

(*) Notice: Subject to any disclaimer, the term of this patent is extended or adjusted under 35 U.S.C. 154(b) by 9 days.

(21) Appl. No.: 10/706,622

(22) Filed: Nov. 12, 2003

(65) Prior Publication Data

US 2004/0094785 A1 May 20, 2004

Related U.S. Application Data

(60) Provisional application No. 60/427,164, filed on Nov. 18, 2002.

(51) Int. Cl.[7] ............................................. H01L 29/76
(52) U.S. Cl. ...................... 257/295; 257/298; 257/303; 257/306; 257/324; 438/3; 438/240
(58) Field of Search .................................. 257/108, 252, 257/421–427, 295, 298, 314, 324–326

(56) References Cited

U.S. PATENT DOCUMENTS

| | | | |
|---|---|---|---|
| 5,343,422 A | | 8/1994 | Kung et al. |
| 5,475,304 A | | 12/1995 | Prinz |
| 5,477,482 A | | 12/1995 | Prinz |
| 5,541,868 A | * | 7/1996 | Prinz ........................... 365/98 |
| 5,640,343 A | | 6/1997 | Gallagher et al. |
| 5,661,062 A | | 8/1997 | Prinz |

(Continued)

FOREIGN PATENT DOCUMENTS

| | | |
|---|---|---|
| EP | 0 681 338 | 11/1998 |
| EP | 0 910 092 | 4/1999 |
| WO | WO 98/15897 | 4/1998 |
| WO | WO 98/44481 | 10/1998 |

OTHER PUBLICATIONS

Zhu et al., "A Vertical MRAM Free of Write Disturbance," IEEE Transactions on Magnetics, vol. 39, No. 5, Sep. 2003, Carnegie Mellon University, Pittsburgh, PA.

Zhu et al., Characteristics of AP Bias in Spin Valve Memory Elements, Jul. 1998, IEEE Transactions on Magnetics, vol. 34, No. 4 pp. 1063–1065.

*Primary Examiner*—Andy Huynh
(74) *Attorney, Agent, or Firm*—Kirkpatrick & Lockhart Nicholson Graham LLP

(57) ABSTRACT

Various embodiments of a magnetic memory element, including a storage layer and a reference layer, are disclosed. The storage layer includes two conjugate magnetic domain segments having opposing helicities. The reference layer is permanently magnetized. A non-magnetic layer is interposed between the two magnetic layers. The boundaries of the two conjugate magnetic domain segments of the storage layer define domain walls along the radial direction thereof. The magnetic moment direction of one domain wall points inward and the magnetic moment direction of the other domain wall points outward. The two domain walls always attract each other, leaving one segment significantly larger than the other. These two different conditions (each longer the other) define two binary data states. By sending a vertical current through the magnetic memory element, transitions between the memory states can be achieved. Also disclosed are a memory cell, a memory device, and a computing device.

33 Claims, 11 Drawing Sheets

U.S. PATENT DOCUMENTS

| | | |
|---|---|---|
| 5,729,410 A | 3/1998 | Fontana, Jr. et al. |
| 5,734,605 A | 3/1998 | Zhu et al. |
| 5,745,408 A | 4/1998 | Chen et al. |
| 5,748,524 A | 5/1998 | Chen et al. |
| 5,757,695 A | 5/1998 | Shi et al. |
| 5,768,183 A | 6/1998 | Zhu et al. |
| 5,774,394 A | 6/1998 | Chen et al. |
| 5,793,697 A | 8/1998 | Scheuerlein |
| 5,923,583 A | 7/1999 | Womack |
| 5,969,978 A | 10/1999 | Prinz |
| 6,391,483 B1 * | 5/2002 | Zhu et al. .................. 428/692 |
| 6,639,830 B1 | 10/2003 | Heide |
| 6,643,168 B2 | 11/2003 | Okazawa |
| 6,768,152 B2 * | 7/2004 | Higo .......................... 257/295 |
| 2003/0174537 A1 | 9/2003 | Bloomquist et al. |
| 2003/0183889 A1 | 10/2003 | Kajiyama |
| 2003/0202375 A1 | 10/2003 | Sharma et al. |

\* cited by examiner

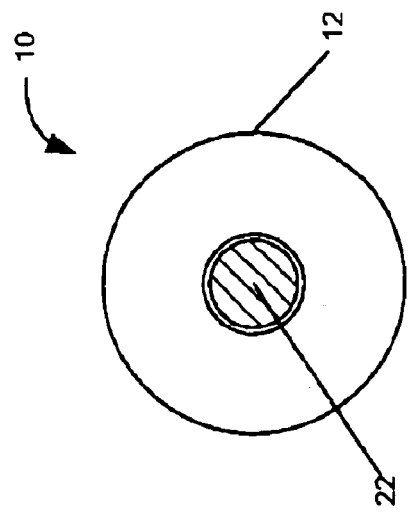
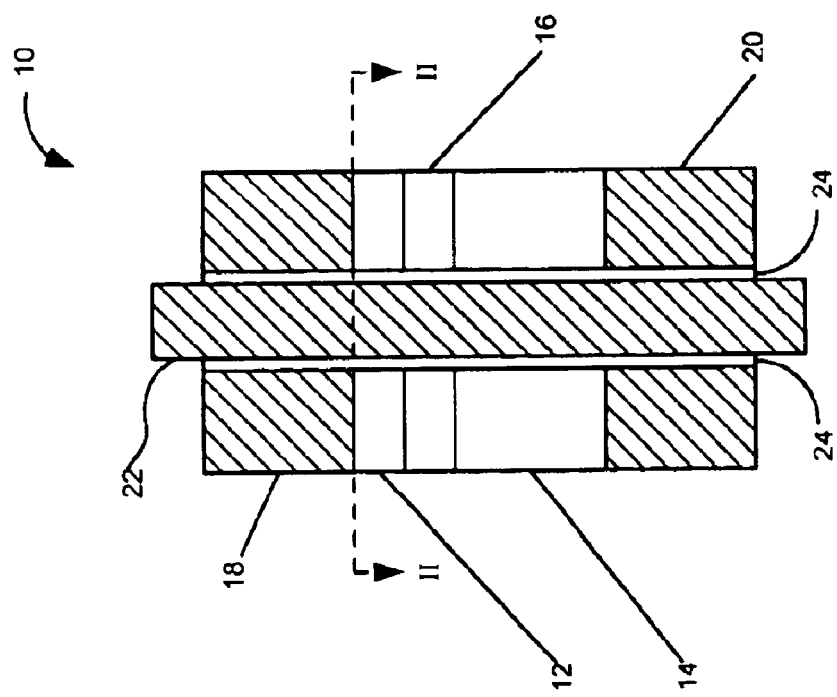

MAGNETIC MEMORY ELEMENT AND MEMORY DEVICE INCLUDING SAME

CROSS-REFERENCE TO RELATED APPLICATIONS

This application claims priority under 35 U.S.C. § 119 to U.S. provisional patent application Ser. No. 60/427,164, filed Nov. 18, 2002, which is incorporated herein by reference.

STATEMENT REGARDING FEDERALLY SPONSORED RESEARCH AND DEVELOPMENT

The U.S. Government may have certain Tights in any patent issued from this application as provided by Grant No. N00014-00-1-0602, awarded by the Department of Navy.

BACKGROUND OF THE INVENTION

Present vertical magnetic random access memory (MRAM) devices comprise a 2 D array of magnetic memory elements. The magnetic memory elements typically include many layers of magnetic and non-magnetic/electrically conductive materials. Electrical current through an associated word line is used to produce a radial magnetic field around the magnetic element to facilitate the switching (or reverse) of the magnetization of a soft (or "free") magnetic layer of the memory element. As much as several milliAmperes of current is typically required to flip the magnetization of the free layer. In addition, when addressing a particular magnetic memory element in the array, the other memory elements in the same row and/or column experience one half of the magnetic field used to flip the particular memory element. These other elements are sometimes referred to as the so-called "half-select" elements, and this is not a desirable condition because it may lead to errors in reading the stored data as well as practical limitations in down size scaling.

SUMMARY OF THE INVENTION

In one general respect, the present invention is directed to a magnetic memory element. According to various embodiments, the magnetic memory element includes at least two magnetic layers: a storage layer and a reference layer. The memory element may, for example, be ring-shaped or any other closed-ended configuration defining an aperture. The storage layer includes two conjugate magnetic domain segments having opposing helicities. The reference layer is permanently magnetized (i.e., has a permanent magnetic helicity). In addition, a non-magnetic middle layer is interposed between the two magnetic layers. The middle layer may include, for example, an electrically conductive layer, in which case the two magnetic layers and the middle layer may constitute a current-perpendicular-to plane/giant magneto-resistive (CPP/GMR) structure. According to another embodiment, the middle layer may include an electrically insulating layer, in which case the two magnetic layers and the middle layer may constitute a magnetic tunnel junction (MTJ) structure.

The boundaries of the two conjugate magnetic domain segments of the storage magnetic layer define domain walls that are along the radial direction of the storage layer. The magnetic moment direction within one domain wall points inward and the magnetic moment direction within the other domain wall points outward. The two domain walls always attract each other, leaving one segment significantly larger than the other. These two different conditions (each longer the other) may define two binary data states. By sending a vertical current through the magnetic memory element, which generates a circular magnetic field, transitions between the memory states can be achieved. According to various embodiments, the aperture through the element may be in the center thereof or offset from the center.

In other general respects, embodiments of the present invention are directed to: a memory cell including the magnetic memory element; a memory device including a plurality of the memory cells; and a computing device including the memory device.

A memory cell utilizing the magnetic memory element of the present invention may provide the powerful advantage of low power operation. This is because the magnetic switching between the two binary states may be realized with very low, but circular magnetic fields. In addition, the switching current required to transition between memory states is much lower than the conventional MRAM design. Accordingly, the power consumption with a memory device according to various embodiments of the present invention may be 1000 to 10,000 times less than that of the conventional MRAM design. Moreover, various embodiments of the memory cell of the present invention require only one transistor for both read and write operations. In addition, embodiments of the memory cell eliminate the need for word lines as in conventional MRAM designs, which thereby eliminates the problem of half-selected elements, making it free of addressing disturbances. These and other benefits of the invention will be apparent from the description to follow.

DESCRIPTION OF THE DRAWINGS

Embodiments of the present invention are be described in conjunction with the following figures, wherein:

FIG. 1 is a cross-sectional side view of a magnetic memory element according to various embodiments of the present invention;

FIG. 2 is a cross-sectional top view of the magnetic memory element of FIG. 1 according to various embodiments;

DETAILED DESCRIPTION OF THE INVENTION

Figure 3A:
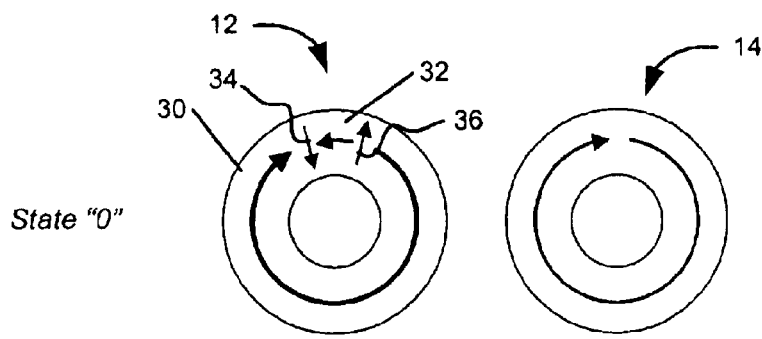
FIGS. 3A and 3B are diagrams of the magnetization helicities of the magnetic layers of the magnetic memory element according to various embodiments of the present invention.

The present invention is directed, according to various embodiments, to a magnetic memory element 10, such as may be used in a magnetic memory device. FIG. 1 is a cross-sectional side view of the magnetic memory element and FIG. 2 is a cross-sectional top plan view according to various embodiments. The magnetic memory element 10 may comprise a stack of multiple closed-ended (e.g., ring-shaped) layers. The element 10 may include two magnetic layers: a storage layer 12 and a reference layer 14. The magnetic layers 12, 14 may include a magnetic material such as, for example, CoFe, NiFeCo or permalloy. The thickness of the storage layer 12 and reference layer 14 may vary depending on the materials used. For instance, the storage layer 12 may have a thickness of between, for example, 10 and 100 Angstroms and the reference layer 14 may have a thickness of, for example, greater than 100 Angstroms. The outer-to-inner diameter ratio ($D_{out}/D_{in}$) of the magnetic memory element 10 may be, for example, greater than or equal to three. Further, the inner diameter may correspond to the smallest attainable feature size, which typically varies with the materials used, but is generally on the order of 0.1 to 0.2 $\mu$m.

A non-magnetic middle layer 16 is provided between the two magnetic layers 12, 14. The middle layer 16 may include an electrically conductive material such as, for example, Cu, in which case the two magnetic layers 12, 14 and the middle layer 16 may constitute a current-perpendicular-to plane/giant magnetoresistive (CPP/GMR) structure. According to other embodiments, the middle layer 16 may include an electrically insulating layer such as $Al_2O_3$, for example. According to such embodiments, the middle layer 16 acts as a barrier layer of a magnetic tunnel junction (MTJ) structure. Interested readers may refer to U.S. Pat. No. 6,391,483 to Zhu et al. (the "'483 patent"), which is incorporated herein by reference, for additional details. For an embodiment utilizing the CPP/GMR structure (i.e., layers 12, 16 and 14), the element 10 may include a number of repeated CPP/GMR structures.

The magnetic memory element 10 may also include upper and lower electrical contact layers 18, 20, comprising an electrically conductive material such as, for example, Cu, to thereby provide electrodes for the magnetic memory element 10.

An electrically-conductive set line 22 may be disposed through the opening defined by the various layers of the element 10 to provide the current-induced magnetic field to transition the state of the memory element 10, as described in more detail below. The set line 22 may be insulated from the layers of the element 10 by an insulating layer 24, which may comprise, for example, $SiO_2$, SiN or an oxide of the materials forming the element 10.

Figure 3B:
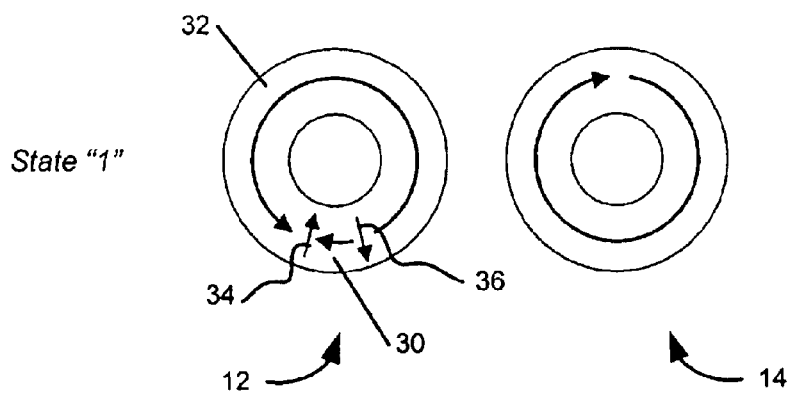

As illustrated in FIGS. 3A and 3B, the magnetic moment direction (i.e., magnetization configuration) of the reference layer 14 may be completely circular along the annulus of the layer 14 and may be naturally permanent. The reference layer 14 may be designed to have a sufficiently great magnetic area moment density such that the helicity of the reference layer 14 does not change during memory operation. As used herein, the term "helicity" refers to the rotational directional (e.g., clockwise (CW) or counterclockwise (CCW)) of the magnetization configuration of a magnetic layer.

Still referring to FIGS. 3A and 3B, the annulus of the storage layer 12 may comprise two conjugate (i.e., joined together) magnetic domain segments 30, 32: one with a CW magnetic moment direction (30) and one with a CCW magnetic moment direction (32). As such, the conjugate magnetic domain segments 30, 32 of the storage layer 12 may have opposing helicities. The pair of boundaries between the conjugate segments 30, 32 may define a pair of domain walls 34, 36. Both of the domain walls 34, 36 may be along the radial direction of the layer 12 and the magnetic moments may point inward within one of the domain walls (34) and may point outward within the other domain wall (36).

The two domain walls 34, 36 will attract each other, leaving one segment significantly larger than the other. For example, in FIG. 3A the CW segment 30 is larger than the CCW segment 32 and in FIG. 3B the CCW segment 32 is larger than the CW segment 30. These two conditions may define that two binary data states, i.e. "1"'s and "0"'s for the memory element 10. For example, FIG. 3A may correspond to a "0" state and FIG. 3B may correspond to a "1" state.

Figure 4:
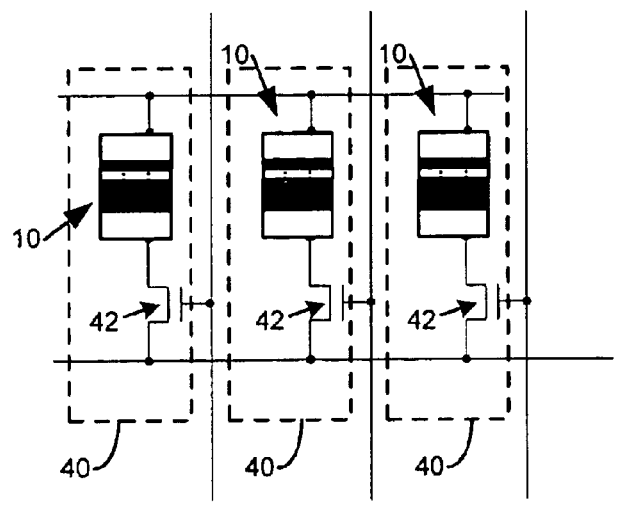
FIG. 4 is a diagram of memory cells according to various embodiments of the present invention.

The present invention is also directed, according to various embodiments, to a memory cell. FIG. 4 illustrates three such memory cells 40. Each memory cell 40 may include the magnetic memory element 10 and a transistor 42, such as a field effect transistor (FET). An array of such memory cells 40 may form a memory block of a MRAM memory device, as described further herein. The conducting set line 20 (see FIGS. 1 and 2) may be connected to a terminal of the transistor 42 and pass through the opening of the magnetic memory element 10.

Memory cells 40 according to embodiments of the present invention may provide the powerful advantage of low power operation. This is because the magnetic switching between the two binary states (see FIGS. 3A and 3B) may be realized with very low, but circular magnetic fields induced by current passing through the conducting set line 20. By sending a vertical current through the magnetic memory element 10, which generates a circular magnetic field, transitions between the memory states can be achieved. According to one embodiment, the switching current though the set line 20 may be as low as a few hundred micro-Amperes, much less than existing vertical MRAM devices. In addition, such low currents enable the use of MTJ structures for the magnetic memory element 10, as described previously, to thereby obtain a high signal level with a negligibly small sense current level.

Figures 5A, 5B, 5C, 5D:
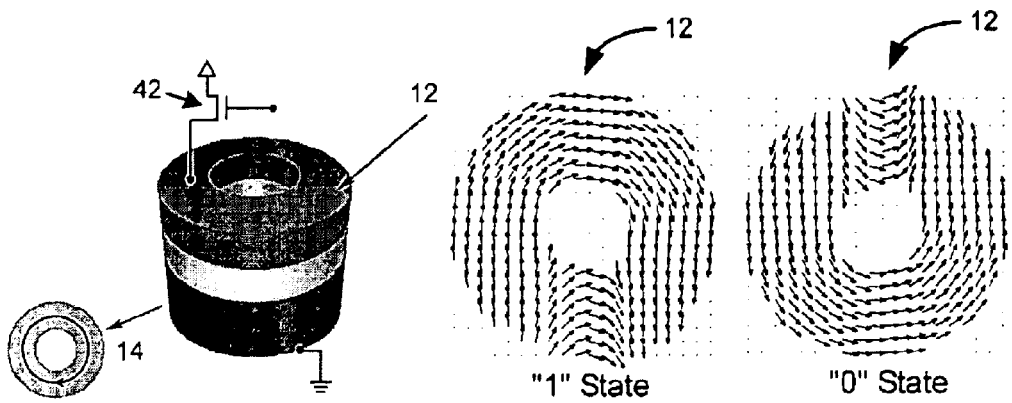
FIGS. 5A–5D illustrate operation of the magnetic memory element according to various embodiments of the present invention.

The diagrams of FIG. 5 help to illustrate the operation of the memory cell 40 according to various embodiments of the present invention. FIG. 5A shows the magnetization of the reference (or "hard") layer 14. FIG. 5B shows a 3D perspective of the magnetic memory element 10. FIGS. 5C and 5D show magnetic field vectors of the storage ("free") layer 12 for the "1" and "0" states respectively.

Figure 6:
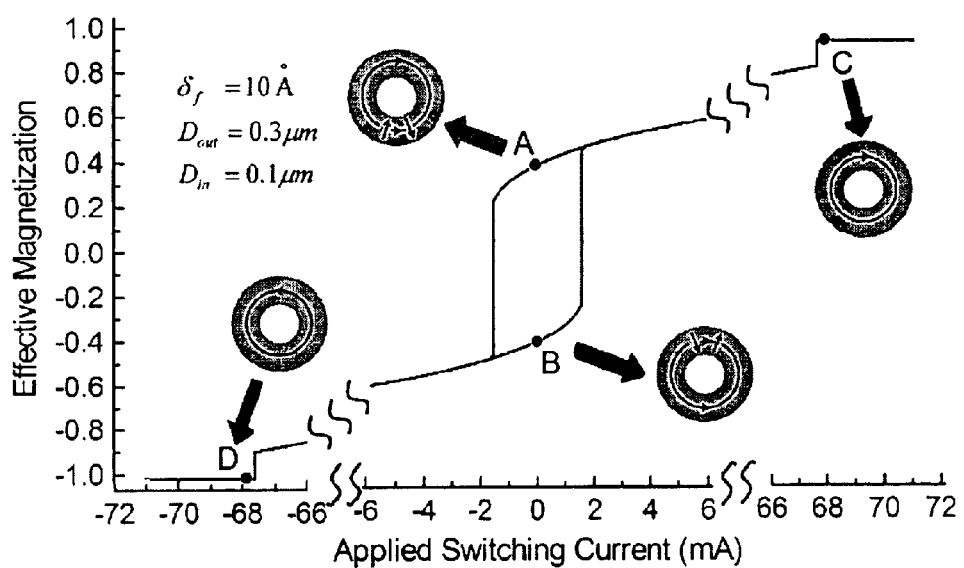
FIGS. 6, 7 and 9 are graphs showing micromagnetic simulation results.
Figure 7:
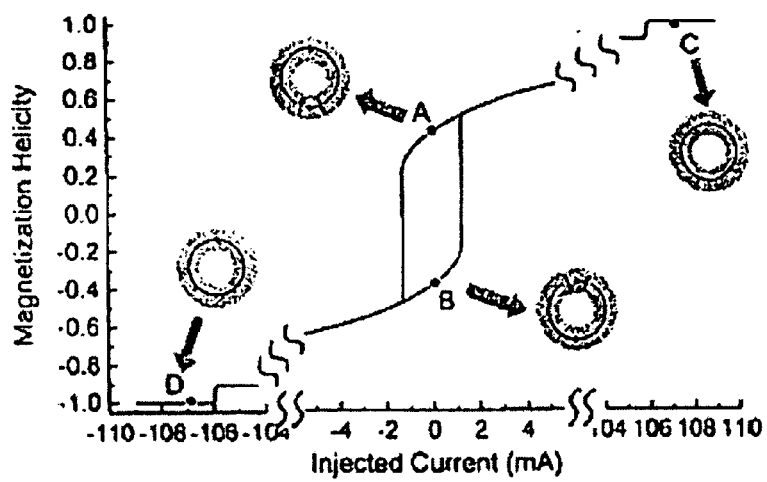

The annihilation of the two domain walls 34, 36 in the storage layer 12, which leads to a complete circular magnetization configuration, requires an exceedingly large magnetic field. FIG. 6 illustrates a micromagnetically calculated magnetic cycle for magnetic memory element 10 having an outer diameter of 0.3 $\mu$m and an inner diameter of 0.1 $\mu$m. For these calculations, the storage layer 12 is assumed to be permalloy with $M_s$=800 emu/cm$^3$ and to have a thickness of 10 Angstroms. The switching current of 1.6 mA was used for the transition, corresponding to a magnetic field of 11 Oe at the medium radius. For such an embodiment, a vertical current of 67 mA is needed to yield the complete circular magnetization configuration for the storage layer 12. FIG. 7 shows a similar set of results where the outer and inner diameters of the element 10 are 0.6 μm and 0.1 μm, respectively, with a storage layer 12 thickness of 10 Angstroms. The annihilation of the domain wall-pair in FIG. 7 would occur at a current amplitude of 106 mA. For each of FIGS. 6 and 7, this value (i.e., the current at which annihilation of the domain wall-pair) may be significantly greater than the switching current amplitude used to transition the memory element 10 between the two memory states, although it should be noted that the margin decreases with increasing storage layer thickness.

Figure 8:
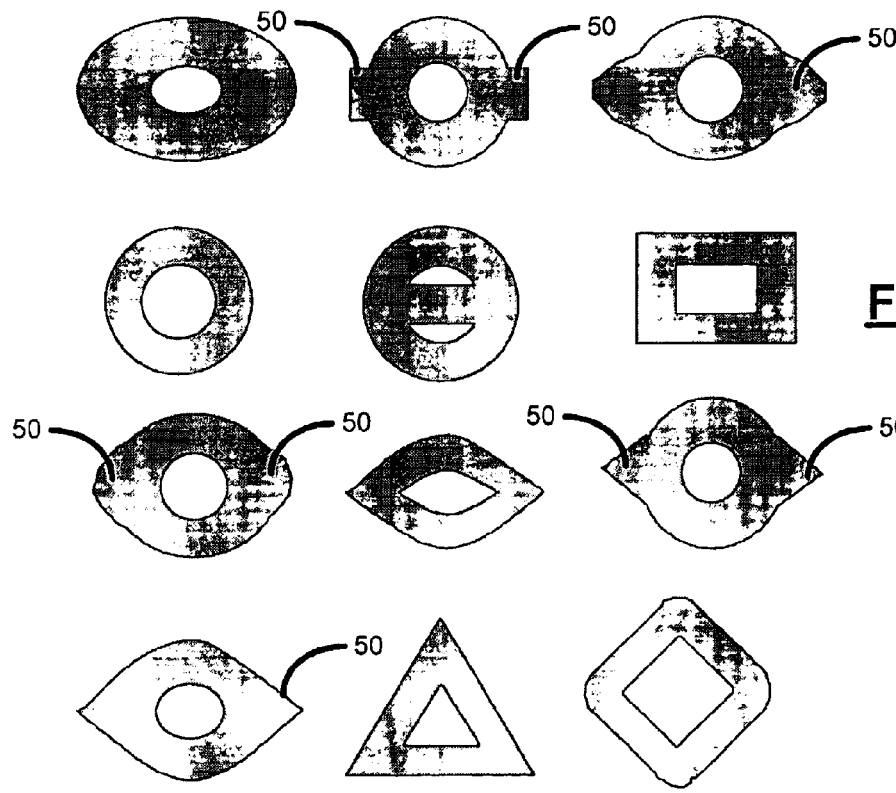
FIGS. 8 and 9a illustrate various geometries for the magnetic memory element.
Figure 9:
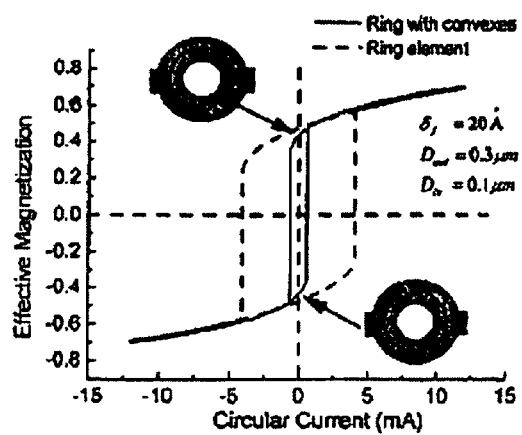

In FIGS. 1 and 2, the magnetic memory element 10 is shown as having a circular cross-section. According to the other elements, the magnetic memory element 10 may assume various other closed-ended configurations, such as shown in FIG. 8. As illustrated in FIG. 8, some configurations may include nodules 50. According to such embodiments, the vertical current threshold for the transition from one memory state to the other can be reduced to the order of $10^2$ μA. Using a MTJ structure for the magnetic memory element 10 is advantageous for such low switching current as a MTJ structure brings the advantages of large read signal amplitude at a small biasing voltage. FIG. 9 illustrates micromagnetic simulation results with two nodules 50 of twenty nm in width (radial direction) and sixty nm in length (circumferential direction). The thickness of the storage layer 12 was chosen as 20 Angstroms for the simulation of FIG. 9, with the rest of dimensions the same as that for FIG. 6. The calculated switching current is 640 μA assuming a pulsed current with a pulse width of 1 ns.

Figure 9A:
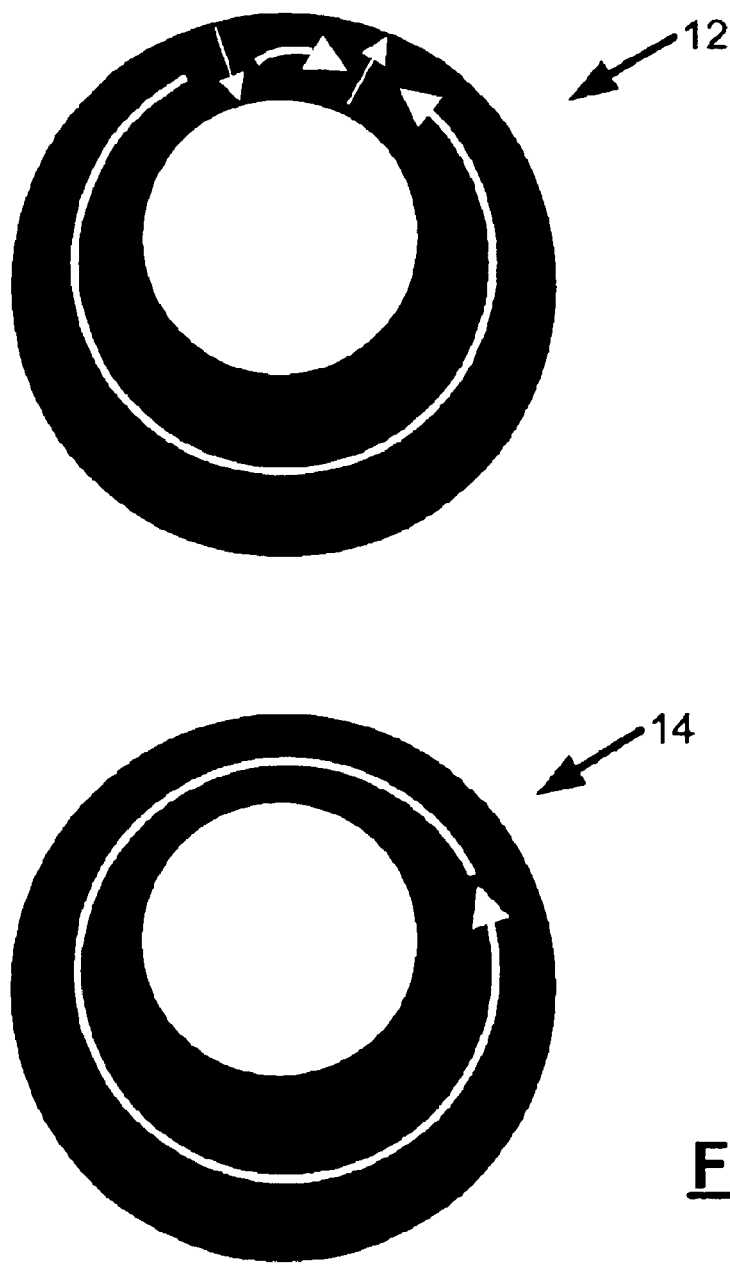

FIG. 9a is diagram of the storage layer 12 and the reference layer 14 according to other embodiments of the present invention. As shown in FIG. 9a, the aperture of the memory element 10 (including the layers 12, 14 illustrated in FIG. 9a) may be offset from the center of the element 10. Such a configuration yields a greater net helicity and, therefore, greater signal strength.

The memory cell 40, according to various embodiments, eliminates the need for word lines and digital lines used for switching the memory states in conventional MRAM designs. The elimination of the word/digital lines brings along the elimination of the so-called "half-select" elements, which is a potentially substantial advantage over conventional MRAM designs. In addition, embodiments of the present invention may consume be 1000 to 10,000 times less power than conventional MRAM designs. The micromagnetic simulations (see, for example, FIGS. 6, 7 and 9) show that with embodiments of the present invention the switching between memory states may be very robust with excellent repeatability. In addition, the low switching current enables the use of MTJ structures, as described previously, that have large read signal amplitudes with negligibly low read current. The low switching current enables the use of the same transistor (such as transistor 42 of FIG. 4) for both write and read addressing.

Figure 10:
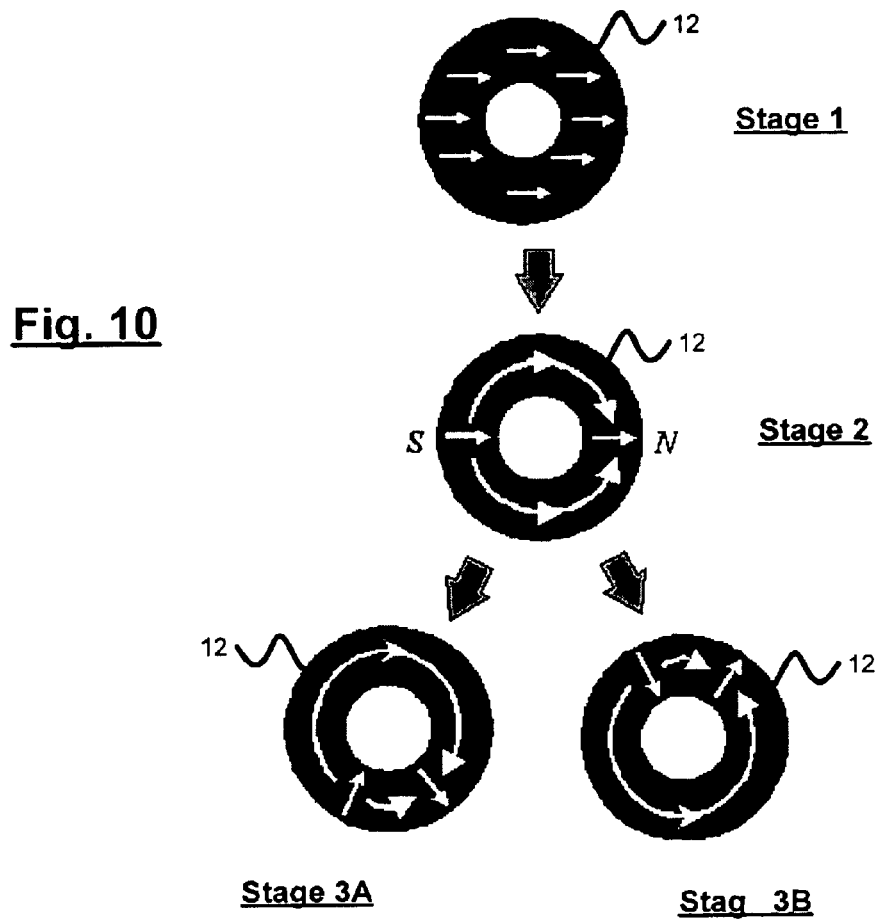
FIG. 10 illustrates a process for magnetizing the storage layer of the magnetic memory element according to various embodiments of the present invention.

FIG. 10 is a diagram illustrating a process for forming the pair of domain walls 34, 36 of the storage layer 12. Initially, as shown at Stage 1, the storage layer 12 may be saturated with a uniform magnetic field. Upon the removal of the field, two domain walls form, as shown at Stage 2: a head-on domain wall at a three o'clock position and a tail-on domain wall at a nine o'clock position. The two walls contain opposite magnetic poles (N and S) and, because of their mutual magnetic attraction, tend to move toward each other to form one of the two memory states, respectively, shown at Stages 3A, B. The energy barrier between the two memory states arises from the magnetostatic interaction between the magnetic poles within the two domain walls 34, 36, as well as the edge poles that would have to be generated to move the walls 34, 36. Since the magnetization of the reference layer 14 may be circular, the memory state may be independent of the actual location of the domain wall-pair. In addition, increasing the thickness of the storage layer 12 increases the energy barrier between the two memory states, thereby raising the switching current threshold as well (see FIG. 14, below).

Figure 11:
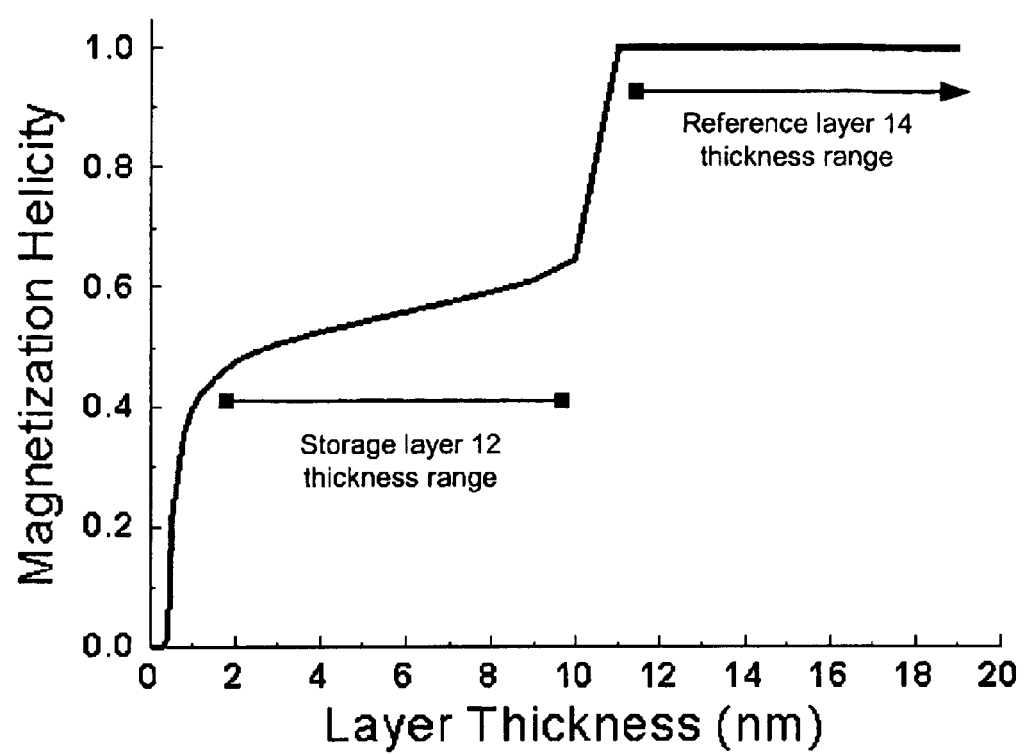
FIG. 11 is a diagram showing thickness ranges for the storage and reference layers of the magnetic memory element for various embodiments.

FIG. 11 is a diagram showing potential thickness ranges for the storage layer 12 and the reference layer 14, where the storage and reference layers 12, 14 are made of a type of permalloy ($Ni_{81}Fe_{19}$) and with an outer diameter to inner diameter ratio of 0.3 μm/0.1 μm. As can be seen in FIG. 11, the magnetization helicity of the storage layer 12 is approximately constant for a thickness range of 2 nm to 10 nm. The magnetization helicity of the reference layer is approximately constant for thicknesses greater than 11.5 nm.

Figure 12:
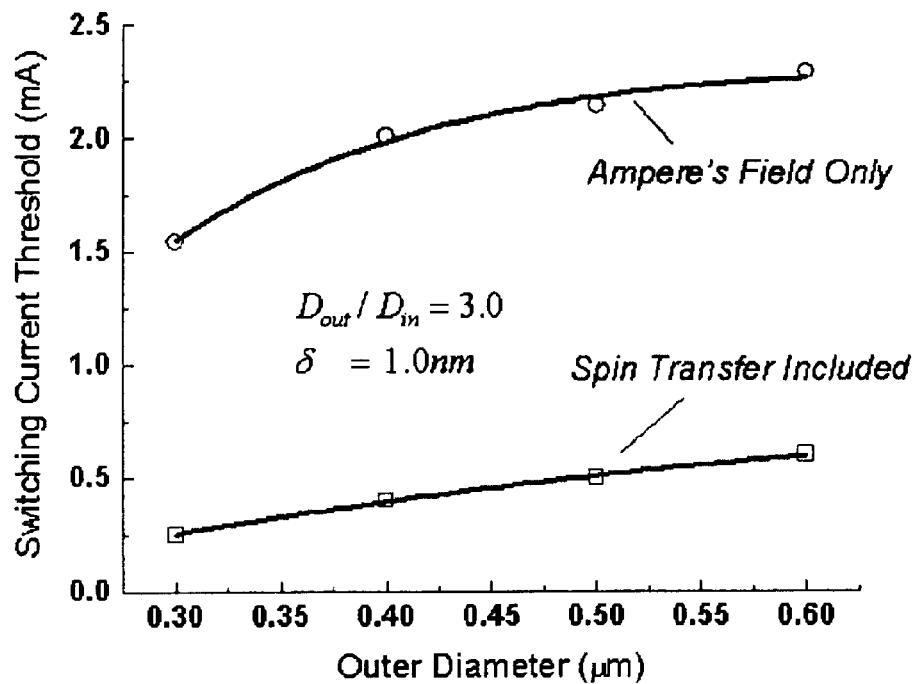
FIGS. 12–14 are diagrams showing the effect of the spin transfer effect for various embodiments of the present invention.
Figure 13:
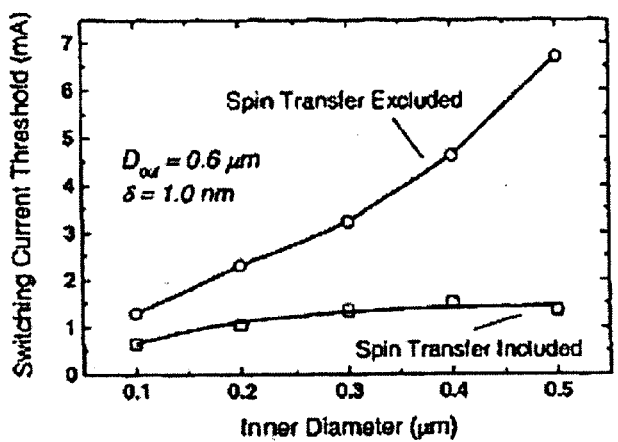
Figure 14:
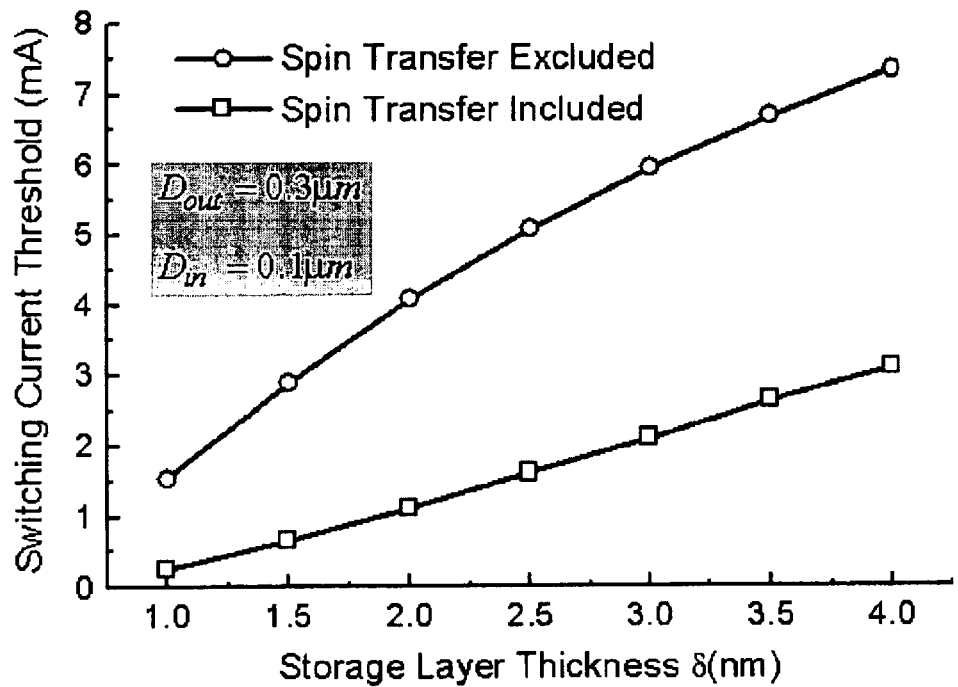

Such small geometries for the magnetic memory element 10 are in part due to spin transfer induced magnetic switching. That is, not only does the Amperean field created by the current running through the conducting set line 20 contribute to the transitions between the logic states, but so does the spin transfer effect. FIG. 12 is a graph illustrating the outer diameter of the element 10 versus the switching current threshold for an outer diameter-to-inner diameter ration of $D_{out}/D_{in}=3.0$ with a storage layer 12 thickness of 1.0 nm. FIG. 13 is a graph illustrating the inner diameter of the element 10 versus the switching current threshold for an outer diameter of $D_{out}=0.6$ μm with a storage layer 12 thickness of 1.0 nm. FIG. 14 is a graph illustrating the storage layer 12 thickness versus the switching current threshold for an outer diameter $D_{out}=0.3$ μm and an inner diameter of $D_{in}=0.1$ μm These figures show that the contribution of the spin transfer effect allows smaller device geometries to be achieved than if only the Amperean field contributed to the switching of the memory element 10.

Figure 15:
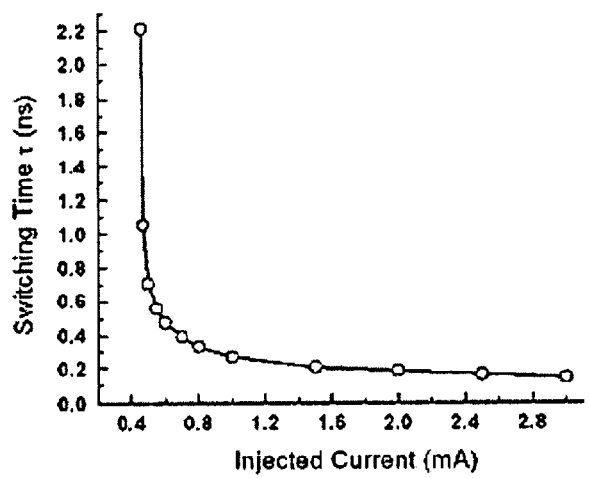
FIG. 15 is a graph of the switching time versus the injected current for various embodiments of the magnetic memory element.

FIG. 15 is a diagram showing the calculated minimum current pulse duration required for switching the memory state of the element 10 as a function of the current amplitude. For the calculations of the FIG. 15, the outer-to-inner diameter ratio $D_{out}/D_{in}=3.0$ and the storage layer 12 thickness was ten Angstroms.

Figure 16:
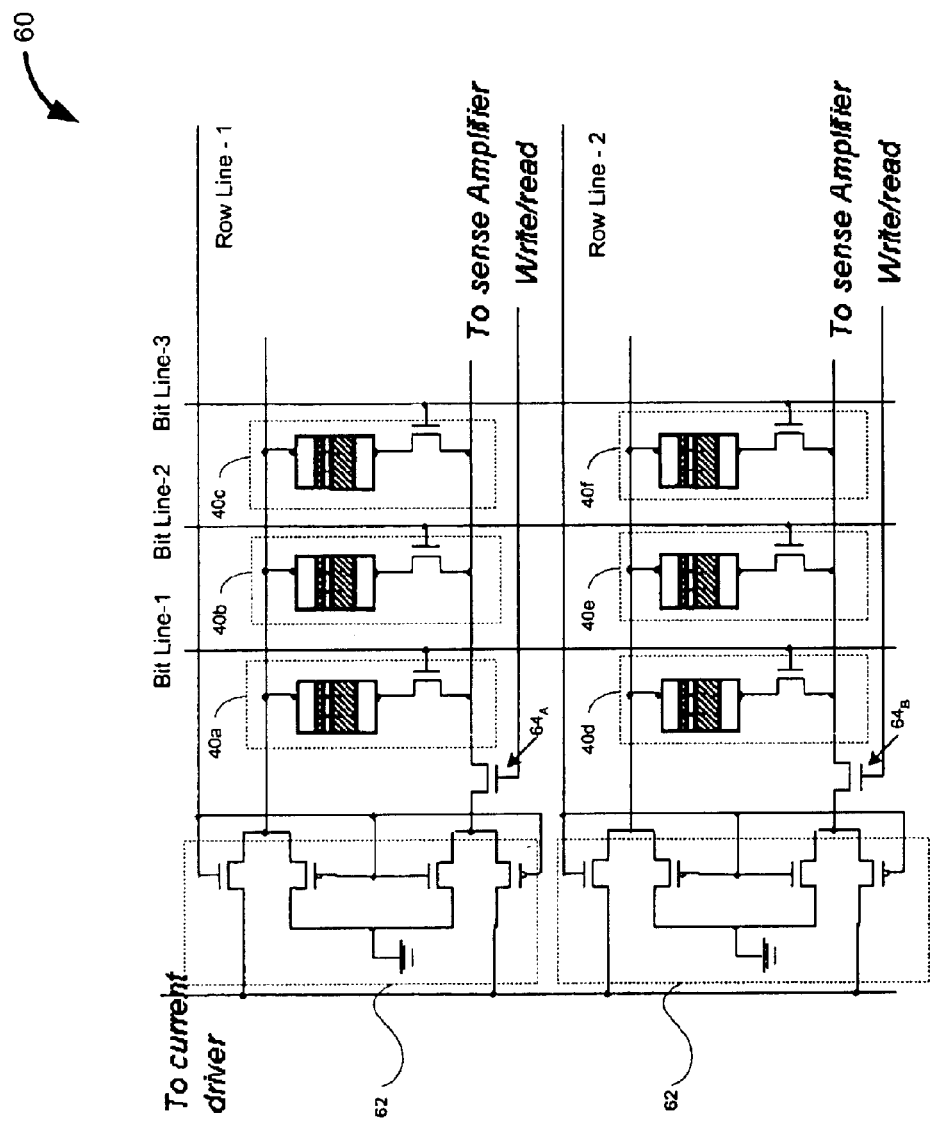
FIG. 16 is a diagram of a memory device according to various embodiment of the present invention.

FIG. 16 is a diagram of a memory device 60 according to various embodiments of the present invention. The memory device 60 includes a two-dimensional array of memory cells 40, addressable by bit lines and row lines. For example, memory cell 40a may be addressed by bit line-1 and row line-1. The row lines may be coupled to the memory cells 40 via addressing circuits 62 comprising, for example, two pair of complementary transistors (e.g., FETs). Write/read operation of the memory device 60 may be controlled via a write/read line via a transistor (e.g. FET) 64. For example, when the write/read line-1 is high, the transistor $64_A$ may be turned on, enabling a write operation. Thus, for example, if the write/read line-1 is high (corresponding to a write operation), the bit line-1 is high, and the row line-1 is high, a "1" may be written to memory cell 40a. Conversely, if the write/read line-1 is high, the bit line-1 is high, and the row line$_1$ is low, a "0" may be written to memory cell $40_a$.

Figure 17:
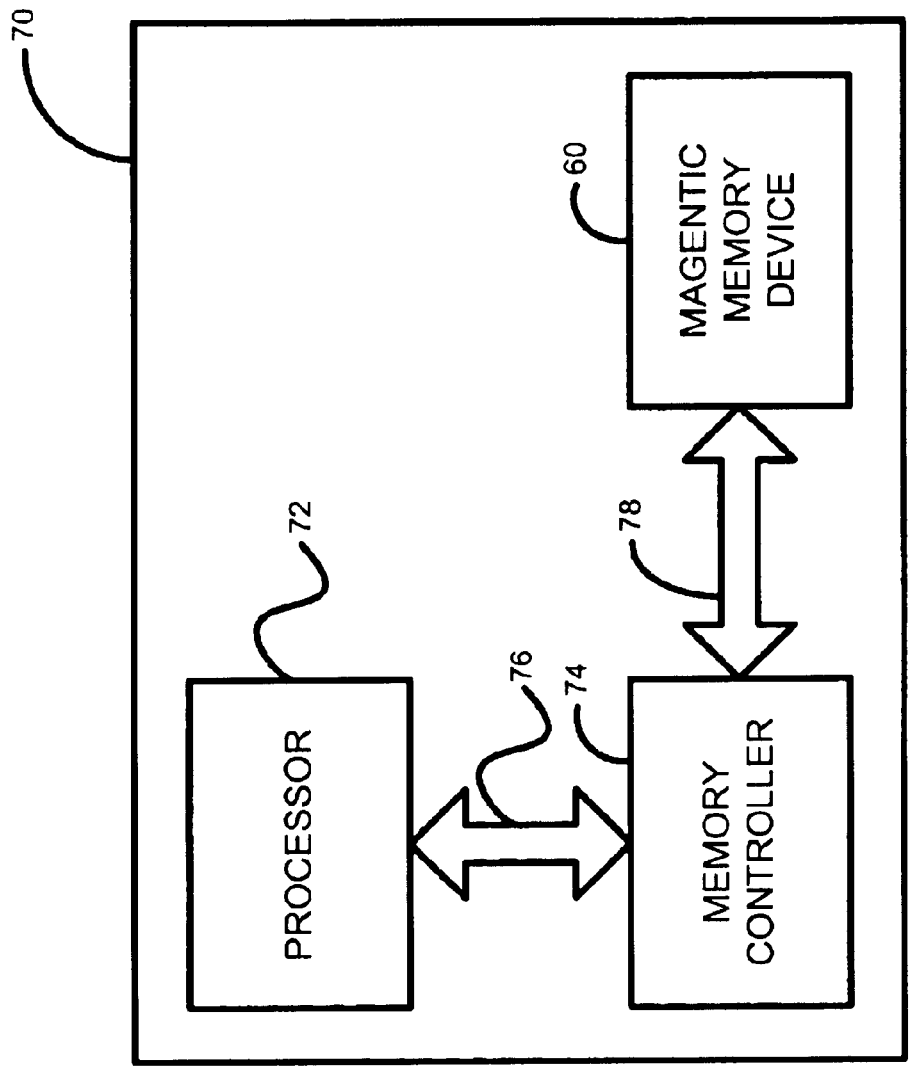
FIG. 17 is a diagram of a computing device according to various embodiments of the present invention.

FIG. 17 is a diagram of a computing device 70 according to various embodiments of the present invention. The computing device 70 includes a processor 72 in communication with a memory controller 74 through a bus 76. The memory controller 74 is in communication with the memory device 60 of the present invention through a bus 78. The computing device 70 may be, for example, a personal computer (PC), a workstation, a laptop computer, a server, a supercomputer, a personal digital assistant (PDA), a pocket-PC, etc.

While several embodiments of the invention have been described, it should be apparent, however, that various modifications, alterations and adaptations to those embodiments may occur to persons skilled in the art with the attainment of some or all of the advantages of the present invention. It is therefore intended to cover all such modifications, alterations and adaptations without departing from the scope and spirit of the present invention as defined by the appended claims.

What is claimed is:

1. A magnetic memory element, comprising a plurality of stacked, closed-ended layers defining an opening therethrough, wherein the plurality of layers includes:
   a reference magnetic layer having a permanent magnetic helicity;
   a storage magnetic layer having two conjugate segments with opposing magnetic helicities; and
   a non-magnetic layer between the reference layer and the storage layer.

2. The memory element of claim 1, wherein the opening is offset from a center of the stacked layers.

3. The memory element of claim 1, wherein the plurality of closed-ended layers includes a plurality of annular layers.

4. The memory element of claim 1, wherein the non-magnetic layer includes an electrically conductive material.

5. The memory element of claim 4, wherein the non-magnetic layer includes Cu.

6. The memory element of claim 1, wherein the non-magnetic layer includes a non-electrically conductive material.

7. The memory element of claim 6, wherein the non-magnetic layer includes $Al_2O_3$.

8. The memory element of claim 1, wherein the reference layer, the storage layer and the non-magnetic layer constitute a magnetic tunnel junction structure.

9. The memory element of claim 1, wherein the reference layer, the storage layer and the non-magnetic layer constitute a first GMR structure.

10. The memory element of claim 9, further comprising a second GMR structure.

11. The memory element of claim 1, wherein the storage layer includes at least one nodule.

12. A memory cell, comprising:
   a magnetic memory element including a plurality of stacked, closed-ended layers defining an opening therethrough, wherein the plurality of layers includes:
      a reference magnetic layer having a permanent magnetic helicity;
      a storage magnetic layer having two conjugate segments with opposing magnetic helicities; and
      a non-magnetic layer between the reference layer and the storage layer;
   an electrically conductive set line disposed through the opening of the magnetic memory element; and
   a single transistor connected to the set line.

13. The memory cell of claim 12, wherein the aperture of the magnetic memory element is offset from a center of the magnetic memory element.

14. The memory cell of claim 12, wherein the transistor is for controlling access to the magnetic memory element for read and write operations.

15. The memory cell of claim 14, wherein the reference layer, the storage layer and the non-magnetic layer of the magnetic memory element constitute a magnetic tunnel junction structure.

16. The memory cell of claim 14, wherein the reference layer, the storage layer and the non-magnetic layer of the magnetic memory element constitute a GMR structure.

17. A memory device, comprising a plurality of magnetic memory elements, each magnetic memory element including a plurality of stacked, closed-ended layers defining an opening therethrough, wherein the plurality of layers includes:
   a reference magnetic layer having a permanent magnetic helicity;
   a storage magnetic layer having two conjugate segments with opposing magnetic helicities; and
   a non-magnetic layer between the reference layer and the storage layer.

18. The memory device of claim 17, wherein the magnetic memory elements are arranged in a 2D array.

19. The memory device of claim 18, wherein the reference layer, the storage layer and the non-magnetic layer of the magnetic memory element constitute a magnetic tunnel junction structure.

20. The memory device of claim 18, wherein the reference layer, the storage layer and the non-magnetic layer of the magnetic memory element constitute a GMR structure.

21. The memory device of claim 17, wherein the opening of at least one of the magnetic memory elements is offset from a center of the magnetic memory element.

22. A memory device, comprising:
   a plurality of memory cells, each memory cell including:
      a magnetic memory element including a plurality of stacked, closed-ended layers defining an opening therethrough, wherein the plurality of layers includes:
         a reference magnetic layer having a permanent magnetic helicity;
         a storage magnetic layer having two conjugate segments with opposing magnetic helicities; and
         a non-magnetic layer between the reference layer and the storage layer;
      an electrically conductive set line disposed through the opening of the magnetic memory element; and
      a single transistor connected to the set line; and
   at least one addressing circuit connected to the plurality of memory cells.

23. The memory device of claim 22, wherein the transistor of each of the memory cells is for controlling access to the magnetic memory element of the respective memory cell for read and write operations.

24. The memory device of claim 22, wherein the reference layer, the storage layer and the non-magnetic layer of the magnetic memory element constitute a magnetic tunnel junction structure.

25. The memory device of claim 22, wherein the reference layer, the storage layer and the non-magnetic layer of the magnetic memory element constitute a GMR structure.

26. The memory device of claim 22, wherein the magnetic memory elements are arranged in a 2D array comprising a plurality of columns and rows.

27. The memory device of claim 26, wherein a control terminal of the transistor of each memory in a column of the array is coupled to a bit line.

28. The memory device of claim 27, wherein the at least one addressing circuit includes one addressing circuit connected to each row of memory cells in the array.

29. The memory device of claim 22, wherein the aperture of at least one of the magnetic memory elements is offset from a center of the magnetic memory element.

30. A computing device, comprising:
   a processor; and
   a memory device in communication with the processor, wherein the memory device includes a plurality of magnetic memory elements, each magnetic memory element including a plurality of stacked, closed-ended layers defining an opening therethrough, wherein the plurality of layers includes:
      a reference magnetic layer having a permanent magnetic helicity;
      a storage magnetic layer having two conjugate segments with opposing magnetic helicities; and
      a non-magnetic layer between the reference layer and the storage layer.

31. The computing device of claim 30, wherein the reference layer, the storage layer and the non-magnetic layer of the magnetic memory element constitute a magnetic tunnel junction structure.

32. The computing device of claim 30, wherein the reference layer, the storage layer and the non-magnetic layer of the magnetic memory element constitute a GMR structure.

33. The computer device of claim 30, wherein the opening of at least one of the magnetic memory elements is offset from a center of the magnetic memory element.

* * * * *